(12) United States Patent
Ohkawa

(10) Patent No.: US 7,846,758 B2
(45) Date of Patent: Dec. 7, 2010

(54) SEMICONDUCTOR IMAGING DEVICE AND FABRICATION PROCESS THEREOF

(75) Inventor: Narumi Ohkawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 105 days.

(21) Appl. No.: 12/292,234

(22) Filed: Nov. 14, 2008

(65) Prior Publication Data

US 2009/0075416 A1 Mar. 19, 2009

Related U.S. Application Data

(62) Division of application No. 11/250,345, filed on Oct. 17, 2005, now abandoned.

(30) Foreign Application Priority Data

Jul. 29, 2005 (JP) ............... 2005-220131

(51) Int. Cl.
*H01L 21/00* (2006.01)

(52) U.S. Cl. ............... 438/48; 438/57; 438/73; 257/431

(58) Field of Classification Search ............ 438/48, 438/57, 73
See application file for complete search history.

(56) References Cited

U.S. PATENT DOCUMENTS 5,181,093 A 1/1993 Kawaura
5,268,587 A 12/1993 Murata et al.
6,023,081 A 2/2000 Drowley et al.

(Continued)

FOREIGN PATENT DOCUMENTS

EP 1 450 410 A2 8/2004

(Continued)

OTHER PUBLICATIONS

Office Action mailed Nov. 25, 2008 issued in Japanese Patent Application No. 2005-220131.

(Continued)

*Primary Examiner*—Bradley K Smith
*Assistant Examiner*—Alexander Belousov
(74) *Attorney, Agent, or Firm*—Westerman, Hattori, Daniels & Adrian, LLP

(57) ABSTRACT

A semiconductor imaging device includes a photodetection region formed of a diffusion region of a first conductivity type formed in an active region of a silicon substrate at a first side of a gate electrode such that a top part thereof is separated from a surface of the silicon substrate and such that an inner edge part invades underneath a channel region right underneath the gate electrode, a shielding layer formed of a second conductivity type at a surface of the silicon substrate at the first side of the gate electrode such that an inner edge part thereof is aligned with a sidewall surface of the gate electrode at the first side, a floating diffusion region formed in the active region at a second side of the gate electrode, and a channel region formed right underneath said gate electrode, wherein the channel region includes a first channel region part formed adjacent to the shielding layer and a second channel region part formed adjacent to the floating diffusion region, wherein the second channel region part contains an impurity element with a concentration level lower than the impurity concentration level of the first channel region part.

2 Claims, 18 Drawing Sheets

U.S. PATENT DOCUMENTS

| | | |
|---|---|---|
| 6,136,629 A | 10/2000 | Sin |
| 6,504,193 B1 | 1/2003 | Ishiwata et al. |
| 6,690,423 B1 | 2/2004 | Nakamura et al. |
| 6,724,022 B1 | 4/2004 | Yoshida |
| 7,030,433 B2 | 4/2006 | Mimuro et al. |
| 7,329,557 B2 | 2/2008 | Mimuro et al. |
| 2004/0108502 A1 | 6/2004 | Nakamura et al. |
| 2004/0165092 A1 | 8/2004 | Tanaka et al. |
| 2004/0188727 A1 | 9/2004 | Patrick |
| 2005/0001248 A1 | 1/2005 | Rhodes |
| 2005/0082631 A1 | 4/2005 | Mimuro et al. |
| 2005/0280054 A1 | 12/2005 | Park et al. |
| 2006/0158538 A1 | 7/2006 | Rhodes et al. |

FOREIGN PATENT DOCUMENTS

| | | |
|---|---|---|
| EP | 1 524 697 A2 | 4/2005 |
| EP | 1 450 410 A3 | 4/2006 |
| EP | 1 681 721 A2 | 7/2006 |
| EP | 1 524 697 A3 | 10/2006 |
| EP | 1 681 721 A3 | 5/2007 |
| JP | 10-200086 A | 7/1998 |
| JP | 11-274450 | 10/1999 |
| JP | 11-284166 | 10/1999 |
| JP | 2000-091551 | 3/2000 |
| JP | 2001-15727 | 1/2001 |
| JP | 2005-123395 | 5/2005 |
| KR | 2003-0046924 | 6/2003 |

OTHER PUBLICATIONS

Ikuko Inoue et al., "Low-Leakage-Current and Low-Operating-Voltage Buried Photodiode for a CMOS Imager", IEEE Transactions on Electron Devices, pp. 43-47, vol. 50, No. 1, Jan. 2003.

Korean Office Action mailed Oct. 25, 2006, issued in corresponding Korean Application No. 10-2005-0105215.

European Search Report dated Aug. 2, 2007, issued in corresponding European Patent Application No. 05 25 6468.

RELATED ART      FIG.5
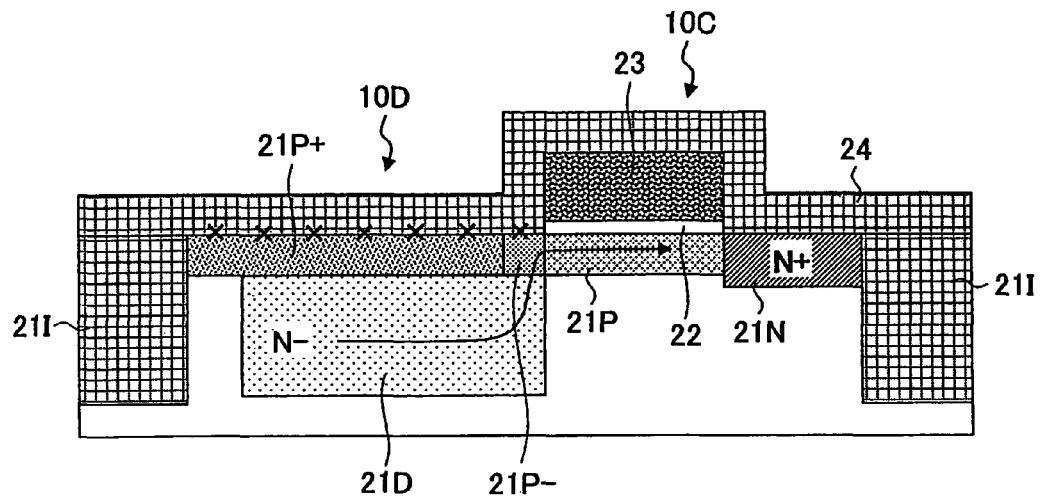
RELATED ART
FIG.6
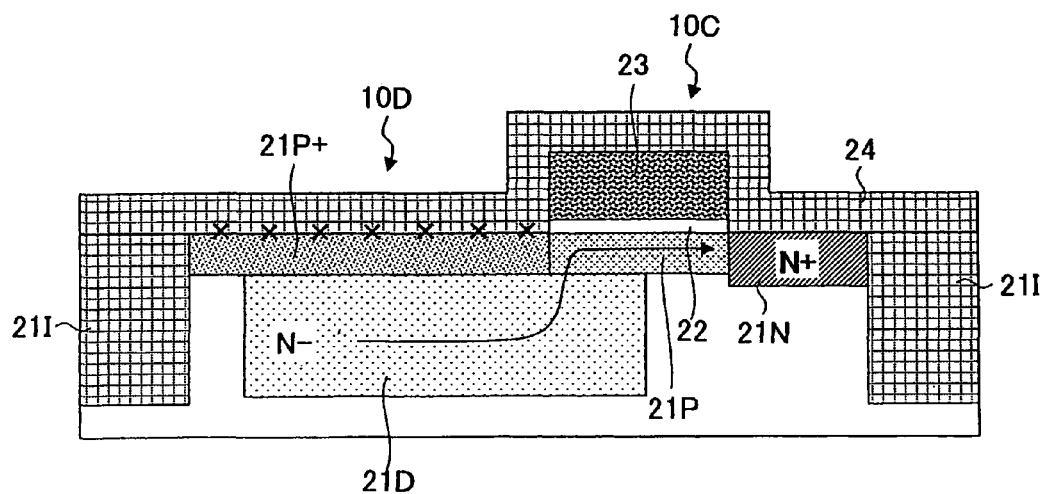

21D  21P  21N

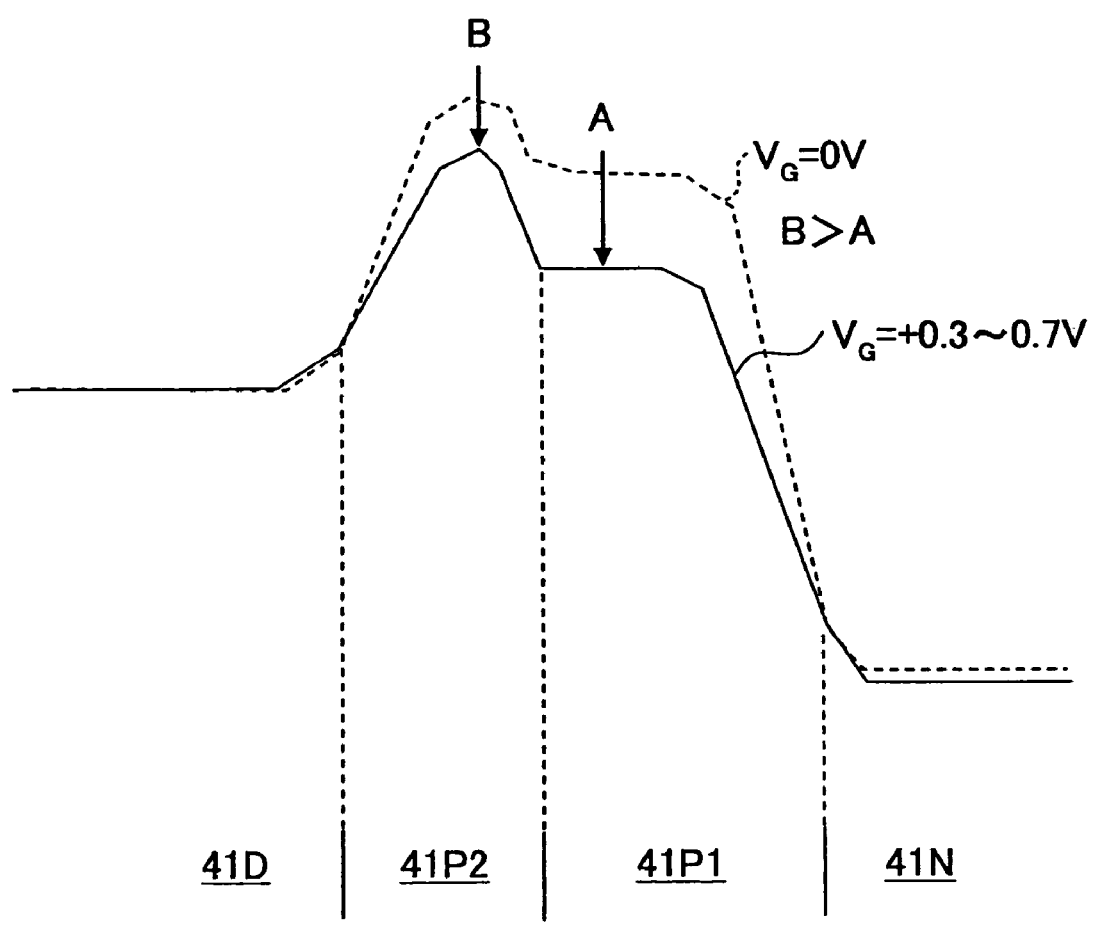

SEMICONDUCTOR IMAGING DEVICE AND FABRICATION PROCESS THEREOF

CROSS-REFERENCE TO RELATED APPLICATION

The present application is a divisional application of U.S. Ser. No. 11/250,345, filed Oct. 17, 2005, and is based on Japanese priority application No. 2005-220131 filed on Jul. 29, 2005, the entire contents of which are hereby incorporated by reference.

BACKGROUND OF THE INVENTION

The present invention generally relates to semiconductor devices and more particularly to a semiconductor photodetection device constituting a CMOS imaging apparatus.

Today, CMOS imaging apparatuses are used extensively in cellular phones with camera, digital still cameras, and the like. A CMOS imaging apparatus has an advantageous feature over a CCD imaging apparatus in that the construction thereof is simple and can be produced with low cost.

FIG. 1 shows the construction of such a CMOS imaging apparatus 100.

Referring to FIG. 1, the CMOS imaging apparatus 100 includes a photodetection region 101A in which a large number of CMOS pixel elements 10 are arranged in rows and columns, wherein a row selection circuit 101B and a signal reading circuit 101C are provided so as to cooperate with the CMOS pixel elements 10 in the photodetection region 101A. Here, the row selection circuit 101B selects a transfer control line TG, a reset control line RST and a selection control line SEL of a desired CMOS pixel element 10, while the signal reading circuit 101C supplies a reset voltage to the reset voltage line VR and reads out the signal voltage from the pixel, which is output to the signal reading line SIG.

FIG. 2 shows the construction of the CMOS device 10 for one pixel used in the CMOS imaging apparatus 100 of FIG. 1.

Referring to FIG. 2, a photodiode 10D is connected to a power supply terminal 10A connected to the reset voltage line VR and supplied with a reset voltage, wherein the photodiode 10D is connected to the power supply terminal 10A in a reverse bias state via a reset transistor 10B controlled by a reset signal on the reset control line RST and a transfer gate transistor 10C controlled by a transfer control signal on the transfer control line TG. Thereby, the photoelectrons formed by optical irradiation in the photodiode 10D are accumulated in a floating diffusion region FD forming an intermediate node between the reset transistor 10B and the transfer gate transistor 10C. Thereby, the photoelectrons are converted to voltage in the floating diffusion region FD.

In the construction of FIG. 2, a voltage signal thus formed in the floating diffusion region FD in response to the photoelectrons from the photodiode 10D is taken over by a reading transistor 10F driven by a supply voltage from the power supply terminal 10A, wherein the reading transistor 10F forms a source follower circuit and supplies an output signal to the signal line SIG via a select transistor 10S connected in series to the reading transistor 10F. The select transistor 10S is controlled by a selection control signal on the selection control line SEL and the output of the read transistor 10F is obtained on the signal line SIG in response to activation of the select transistor 10S via the selection control signal on the selection control line SEL.

FIG. 3 is a diagram explaining the operation of the CMOS pixel element 10 of FIG. 2.

Referring to FIG. 3, the selection control signal on the selection control line SEL rises first, and a row of CMOS pixel elements including the desired CMOS pixel element is selected as a result of conduction of the select transistor 10S.

Next, the reset signal on the reset control line RST goes high, causing conduction of the reset transistor 10B. With this, the floating diffusion region FD is charged to a initial state (resetting). In this stage, it should be noted that the transfer gate transistor 10C is turned off. In response to the rising of the reset signal, the potential of the floating diffusion region FD rises at the same time, and the effect of this rising potential of the floating diffusion region FD is transferred also to the signal line SIG via the reading transistor 10F and the select transistor 10S in the conduction state, while it should be noted that this rising of the signal line SIG is not used for reading of the signal.

Next, the reset signal goes low, and the potential of the floating diffusion region FD is read out to the signal line SIG by the reading transistor 10F while maintaining the transfer gate transistor 10C in the turned off state. With this, reading of noise level is achieved.

Further, after the foregoing noise level reading, the transfer control signal on the transfer control line TG goes high and the electric charges accumulated inside the photodiode 10D are transferred to the floating diffusion region 10F via the transfer gate transistor 10C. Thereby, the potential of the floating diffusion region 10F changes by $\Delta V = Q/C$ by the transferred electric charge amount Q where C is the capacitance of the floating diffusion region FD. Thus, after the transfer control signal goes low, the potential of the floating diffusion region 10F is read out by the reading transistor 10F and is output to the signal line SIG via the select transistor 10S.

REFERENCES

Patent Reference 1 Japanese Laid-Open Patent Application 11-274450 official gazette
Patent Reference 2 Japanese Laid-Open Patent Application 2001-15727 official gazette
Patent Reference 3 Japanese Laid-Open Patent Application 11-284166 official gazette

SUMMARY OF THE INVENTION

FIGS. 4A and 4B are diagrams showing the transistor 10C and the photodiode 10D in the circuit of the FIG. 2 respectively in the cross-sectional view and plan view.

FIGS. 4A and 4B correspond to the construction of Patent Reference 1 wherein the transistor 10C is formed on a p-type active region 21 defined on a silicon substrate 21 by an STI device isolation region 21I, and a polysilicon gate electrode 23 is formed via a gate insulation film 22 of high quality insulation film typically of a thermal oxide film in correspondence to a p-type channel region 21P.

Further, there is formed an n-type diffusion region 21D that constitutes the photodiode 10D in the silicon substrate 21 at one side of the gate electrode 23, and a diffusion region 21N of $n^+$-type constituting the floating diffusion region FD is formed at the other side of the gate electrode 23.

In operation, the diffusion region 21D undergoes depletion and photoelectrons are formed in response to irradiation of incident light. The photoelectrons thus formed are then caused to flow to the diffusion region 21N at the time of electric charge transfer operational mode via the channel region 21P of the transfer gate transistor 10C formed right underneath the gate electrode 23 as shown by an arrow in FIG. 4A and cause a change of potential therein.

In the construction of FIGS. 4A and 4B, there is formed a shielding layer 21P+ of a highly doped diffusion region of p+-type on the surface of the n-type diffusion region 21D for avoiding leakage current caused in the diffusion region 21D by the interface states at the surface of the silicon substrate. With this, the n-type diffusion region 21D forms a buried diffusion region. By forming such a shielding layer 21P+ of p+-type on the surface of the n-type diffusion region 21D, the interface states represented in the drawing by x are isolated from the n-type diffusion region 21D by the potential barrier formed by the shielding layer 21P+ of p+-type.

On the other hand, when such a shielding layer 21P+ of p+-type is formed on the surface of the n-type diffusion region 21D, there is caused an increase of potential in the path of the photoelectrons shown in FIG. 4A by the arrow for the part circled in the drawing, and efficient transfer of photoelectrons to the floating diffusion region 21N is prevented.

Because of this, Patent Reference 1 discloses the technology of forming a p-type diffusion region 21P− to the part of the p+-type shielding layer 21P+ adjunct to the gate electrode 23 for reducing the potential barrier in this part as shown in FIG. 5. In FIG. 5, those parts corresponding to the parts explained previously are designated by the same reference numerals.

However, in the case that such a low barrier height region 21P− of p−-type is formed on the surface of the silicon substrate 21 adjacent to a CVD oxide film 24, which tends to contain impurities with high probability, it is not possible to eliminate the influence of the interface states existing at the interface between the surface of the silicon substrate 21 and the CVD oxide film 24 satisfactorily, and as a result, there arises a problem in that the leakage current in the n-type diffusion region 21D may be increased.

Because of this, Patent References 2 and 3 propose a construction of extending the n-type diffusion region 21D to the part right underneath the gate electrode 23 as shown in FIG. 6 such that the photoelectrons can flow into the channel region 21P right underneath the gate electrode 23 efficiently as shown in the drawing by an arrow. Thereby, it is attempted to improve the transfer efficiency of the photoelectrons to the floating diffusion region 21N while effectively shielding the influence of the interface states at the surface of the silicon substrate 21 to the photoelectrons at the same time.

With this construction, however, the n-type diffusion region 21D of low potential and the p+-type diffusion region 21P+ forming a potential barrier exist adjacent to the foregoing p-type channel region 21P, and thus, the potential profile taken along the path of the photoelectrons is modified by the influence of these diffusion regions. As a result, there appears a complex potential distribution profile having a dip at the central part as shown in FIG. 7.

It should be noted that the potential barrier formed in the channel region 21P with a dip at the top part functions to collect the electrons, particularly the thermal electrons excited thermally at the interface between silicon substrate 21 and the gate oxide film 22, wherein the electrons thus accumulated in the dip may run down the potential barrier and reach the n-type diffusion region 21D of the photodiode or the floating diffusion region 21N.

Here, the electrons that have reached the floating diffusion region 21N do not cause problem as they are annihilated by the reset operation of FIG. 3. Further, the remaining effect thereof is compensated for by the noise reading step. However, the electrons that have reached the diffusion region 21D of the photodiode are transferred to the floating diffusion region 21N in the charge transfer step of FIG. 3 together with photoelectrons and form a dark current.

In a first aspect, the present invention provides a semiconductor imaging device, comprising:

a silicon substrate defined with an active region;

a gate electrode formed on said silicon substrate in correspondence to a channel region in said active region via a gate insulation film;

a photodetection region formed of a diffusion region of a first conductivity type, said photodetection region being formed in said active region at a first side of said gate electrode such that a top part thereof is separated from a surface of said silicon substrate and such that an inner edge part invades underneath a channel region right underneath said gate electrode;

a shielding layer formed of a diffusion region of a second conductivity type, said shielding layer being formed in said active region at said surface of said silicon substrate at said first side of said gate electrode such that an inner edge part thereof is aligned with a sidewall surface of said gate electrode at said first side, said shielding layer being formed so as to cover a part of said photodetection region located at said first side of said gate electrode;

a floating diffusion region formed of a diffusion region of said first conductivity type, said floating diffusion region being formed in said active region at a second side of said gate electrode; and a channel region formed of a diffusion region of said second conductivity type, said channel region being formed in said active region right underneath said gate electrode, said channel region comprising:

a first channel region part having said second conductivity type, a first end of said channel region being formed adjacent to said shielding layer, another end of said channel region invading to a region right underneath said gate electrode and covering a part of said photodetection region invading underneath said channel region; and a second channel region part having said second conductivity type and formed adjacent to said floating diffusion region, said first channel region part containing an impurity element of said second conductivity type with an impurity concentration level lower than an impurity concentration level in said shielding layer, said second channel region part containing said impurity element with a concentration level lower than said impurity concentration level of said first channel region part.

In another aspect, the present invention provides a semiconductor imaging device, comprising:

a silicon substrate defined with an active region;

a gate electrode formed on said silicon substrate in correspondence to a channel region in said active region via a gate insulation film;

a photodetection region formed of a diffusion region of a first conductivity type, said photodetection region being formed in said active region at a first side of said gate electrode such that a top part thereof is separated from a surface of said silicon substrate and such that an inner edge part invades underneath a channel region right underneath said gate electrode;

a shielding layer formed of a diffusion region of a second conductivity type, said shielding layer being formed in said active region at said surface of said silicon substrate at said first side of said gate electrode such that an inner edge part thereof is aligned with a sidewall surface of said gate electrode at said first side, said shielding layer being formed so as to cover a part of said photodetection region located at said first side of said gate electrode;

a floating diffusion region formed of a diffusion region of said first conductivity type, said floating diffusion region being formed in said active region at a second side of said gate electrode; and a channel region formed of a diffusion region of said second conductivity type, said channel region being formed in said active region right underneath said gate electrode, said channel region comprising:

a first channel region part having said second conductivity type, a first end of said channel region being formed adjacent to said shielding layer, another end of said channel region invading to a region right underneath said gate electrode and covering a part of said photodetection region invading underneath said channel region; and a second channel region part having said second conductivity type and formed adjacent to said floating diffusion region, said first channel region part containing an impurity element of said second conductivity type with an impurity concentration level lower than an impurity concentration level in said shielding layer, said first channel region part and said second channel region part containing an impurity element of said first conductivity type and an impurity element of said second conductivity type, such that a carrier concentration level of said second conductivity type is larger in said first channel region than in said second channel region.

Further, according to another aspect of the present invention, there is provided a method of fabricating a semiconductor imaging device, comprising the steps of:

forming a first diffusion region of a first conductivity type at a surface of a silicon substrate by introducing an impurity element of said first conductivity type into an active region defined on said silicon substrate such that said first diffusion region is formed over an entire surface of said active region with a first depth and a first impurity concentration level;

forming a photodetection region of a second conductivity type underneath said first diffusion region, by covering a first part of said first diffusion region by a first mask pattern and introducing an impurity element of a second conductivity type into said active region in overlapping relationship with said first diffusion region while using said first mask pattern as a mask, such that said impurity element of said second conductivity type is introduced to a second depth deeper than said first depth;

forming a second diffusion region of said first conductivity type on said photodetection region, by introducing an impurity element of said first conductivity type into said active region in overlapping relationship with said photodetection region while using said first mask pattern as a mask to a depth of said first depth or shallower, such that said second diffusion region contains said impurity element of said first conductivity type with a second impurity concentration level higher than in said first diffusion region;

forming a gate electrode on said silicon substrate via a gate insulation film such that said gate electrode covers a boundary of said first diffusion region and said second diffusion region;

forming a shielding layer of a diffusion region of said first conductivity type at a surface of said second diffusion region, by introducing an impurity element of said first conductivity element into said active region while using said gate electrode and a second mask pattern covering a part of said active region at a side opposite to said photodetection region with regard to said gate electrode as a mask, such that said shielding layer contains said impurity element of said first conductivity type with a third impurity concentration level larger than said second impurity concentration level; and forming a floating diffusion region of said second conductivity type by introducing an impurity element of said second conductivity type into said active region while using said gate electrode and a third mask pattern covering a part of said active region at a side of said photodetection region with respect to said gate electrode as a mask.

In a further aspect, the present invention provides a method of fabricating a semiconductor imaging device, comprising the steps of:

forming a first diffusion region of a first conductivity type in an active region defined on a silicon substrate by a device isolation region, by introducing thereto an impurity element of a first conductivity type with a first depth deeper than a bottom edge of said device isolation region;

forming a second diffusion region of a second conductivity type on a surface of said first diffusion region, by introducing an impurity element of a second conductivity type with a second, shallower depth;

forming a well having said second conductivity type and defining a photodetection region of said imaging device in said first diffusion region, by forming a first mask pattern on said active region in correspondence to said photodetection region so as to cover a first region in which said photodetection region is to be formed and by introducing an impurity element of said second conductivity type into said active region to a depth deeper than said bottom edge of said device isolation region but not exceeding a bottom edge of said first diffusion region while using said first mask pattern as a mask;

forming a second region of said second conductivity type but having a carrier concentration level lower than a carrier concentration level of said first region, by introducing an impurity element of said first conductivity type into said active region to said second depth while using said first mask pattern as a mask to said second depth such that said second region is formed in a part of said active region not covered by said first mask pattern;

forming a gate electrode on said silicon substrate via a gate insulation film so as to cover a part of a boundary between said first and second parts;

forming a shielding layer having said second conductivity type and a carrier concentration level higher than said first part in said active region, by covering a part of said active region opposite to said photodetection region with respect to said gate electrode by a third mask pattern, and by introducing a second impurity element to said active region in overlapping relationship with said second diffusion region while using said gate electrode and said third mask pattern as a mask; and forming a floating diffusion region of said first conductivity type in said active region at a side opposite to said photodetection region by introducing thereto an impurity element of said first conductivity type.

According to the present invention, it becomes possible, in a semiconductor imaging device in which a photodiode and a transfer gate transistor are integrated on a silicon substrate and constituting a part of a CMOS imaging apparatus, to form a potential barrier inclined to a floating diffusion region in a channel region of the transfer gate transistor, by forming the diffusion region constituting the photodiode such that a tip end part thereof invades underneath the channel region right underneath the gate electrode of the transfer gate transistor and by forming the channel region such that a part of the channel region close to the photodiode has an increased impurity concentration level or increased carrier concentration level as compared with the part close to the floating diffusion region and functioning as the drain region of the transfer gate transistor.

With such a construction, most of the electrons thermally excited in the channel region at the interface between the silicon substrate and the gate insulation film are caused to flow to the floating diffusion region in the photoreception operational mode of the photodiode for collecting incoming photons, and inflow of thermal electrons to the diffusion region of the photodiode is minimized.

With this, noise caused by thermal electrons is suppressed in the reading operational mode, which follows the foregoing photoreception operational mode and conducted by turning on the transfer gate transistor such that the photoelectrons accumulated in the diffusion region of the photodiode are transferred to the floating diffusion region. Thereby, the S/N ratio of the semiconductor imaging device is improved. Here, it should be noted that the thermal electrons thus flowed into the floating diffusion region are removed in the resetting operational mode conducted in advance of the reading operational mode, and thus, detection of the optical signal is not influenced by such thermal electrons.

Further, with such a semiconductor imaging device, in which the tip end of the diffusion region constituting the photodiode invades to the region right underneath the channel region of the transfer gate transistor, the photoelectrons formed by the photodiode are not affected by the surface states at the surface of the silicon substrate when the transfer gate transistor is turned on, and the photoelectrons are caused to flow to the floating diffusion region. Thereby occurrence of leakage current at the time of reading operational mode is suppressed.

Further, with the transfer gate transistor having such an inclined potential profile in the channel region, it is possible to facilitate discharging of the thermal electrons to the floating diffusion region in the photoreception operational mode of the photodiode in which the transfer gate transistor is turned off, by applying a slight positive voltage to the gate electrode of the transistor.

Further, with such a transfer gate transistor having an inclined potential profile in the channel region, it becomes possible to suppress the excitation of thermal electrons in the channel region by applying a slight negative voltage to the gate electrode in the photoreception mode operation. Thereby, the dark current is suppressed and it becomes possible to realize a semiconductor device of large S/N ratio.

Other objects and further features of the present invention will become apparent from the following detailed description when read in conjunction with the attached drawings.

BRIEF DESCRIPTION OF THE DRAWINGS

FIG. 5 is a diagram showing the construction of another conventional CMOS imaging apparatus;

FIG. 6 is a diagram showing the construction of another conventional CMOS imaging apparatus;

FIG. 12 is a diagram showing an example of driving the transfer gate transistor at the time of detecting operation of the semiconductor imaging device of FIG. 8;

DETAILED DESCRIPTION OF THE INVENTION

First Embodiment

Figure 1:
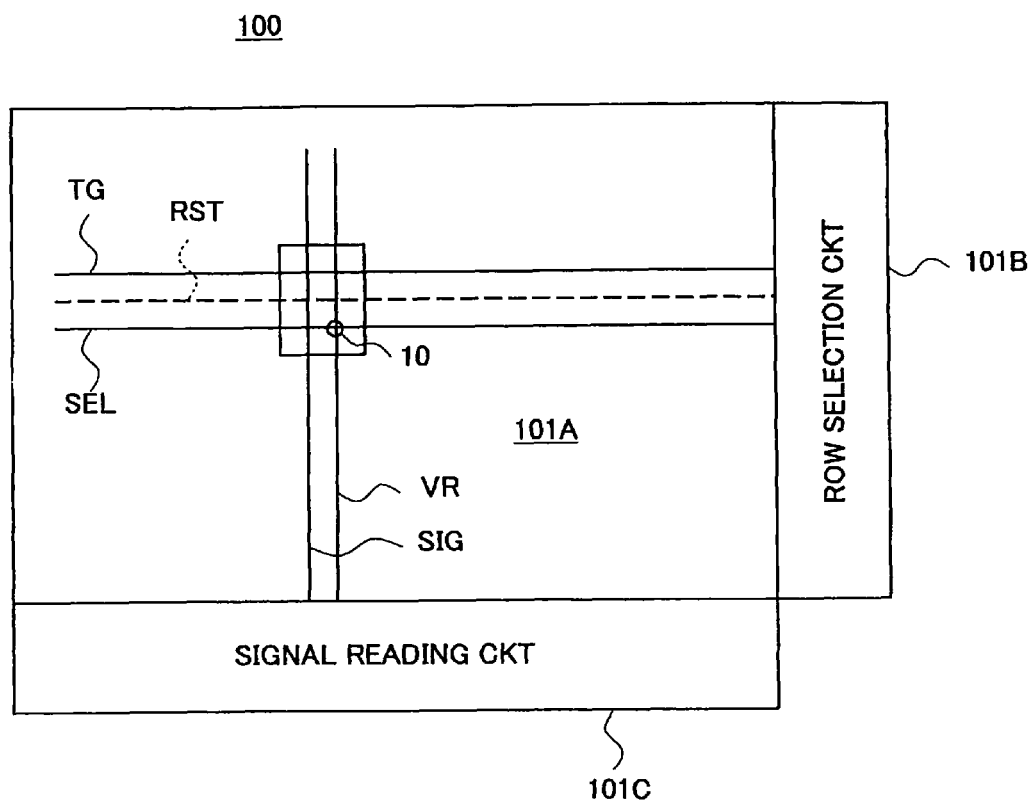
FIG. 1 is a diagram showing an overall construction of a semiconductor imaging device.
Figure 2:
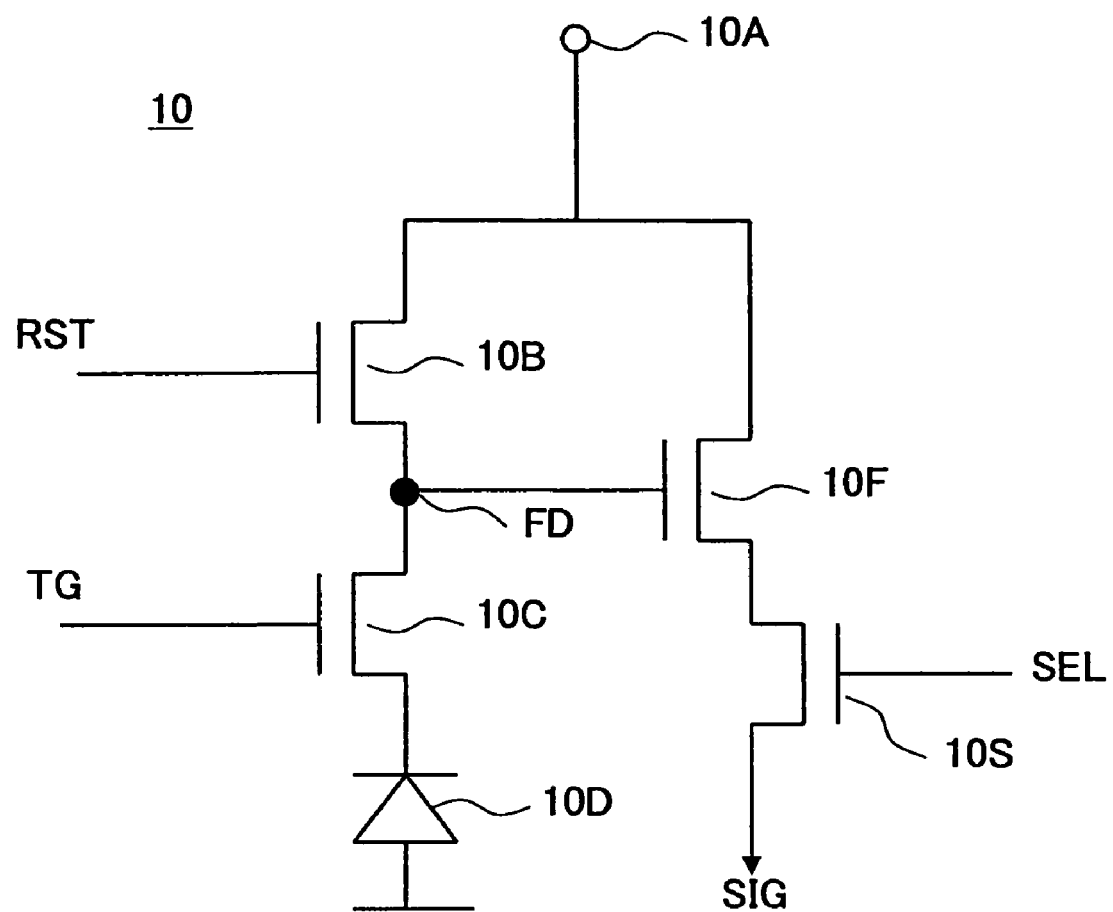
FIG. 2 is a diagram showing the construction of a CMOS imaging apparatus used with the semiconductor imaging device of FIG. 1.
Figure 3:
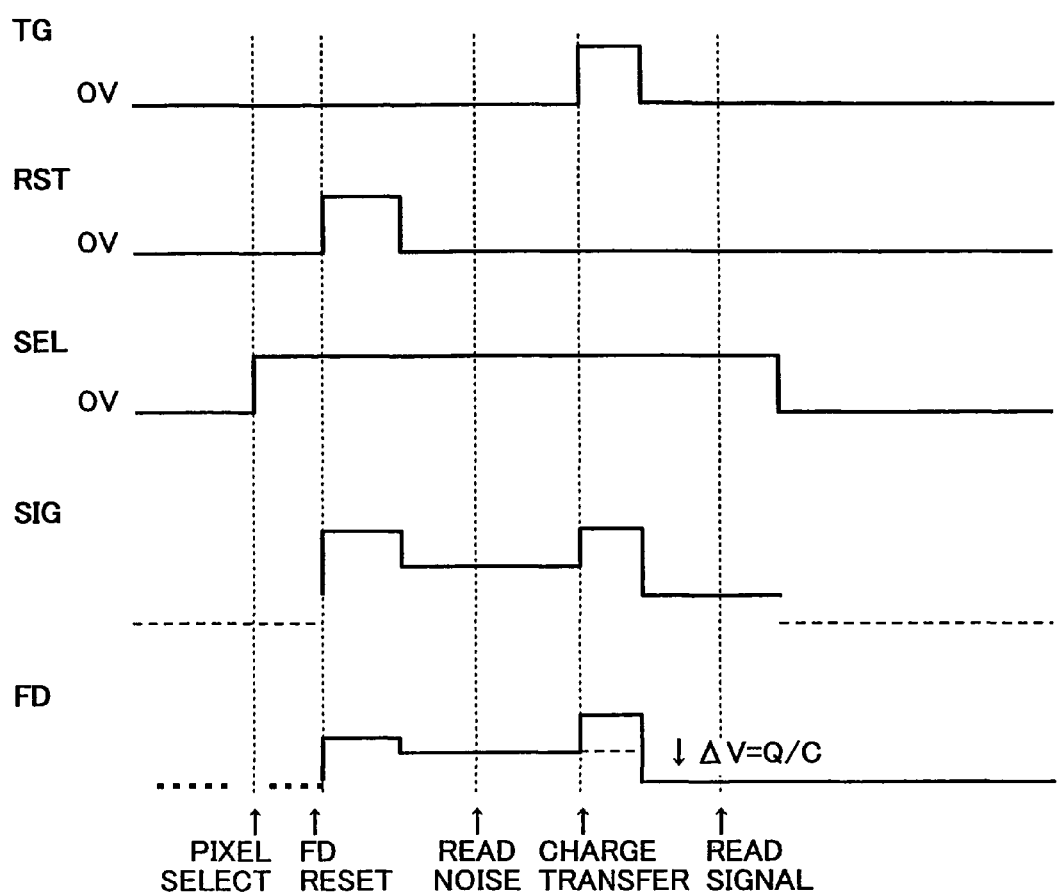
FIG. 3 is a diagram explaining the operation of the CMOS imaging device of FIG. 2.
Figure 4A:
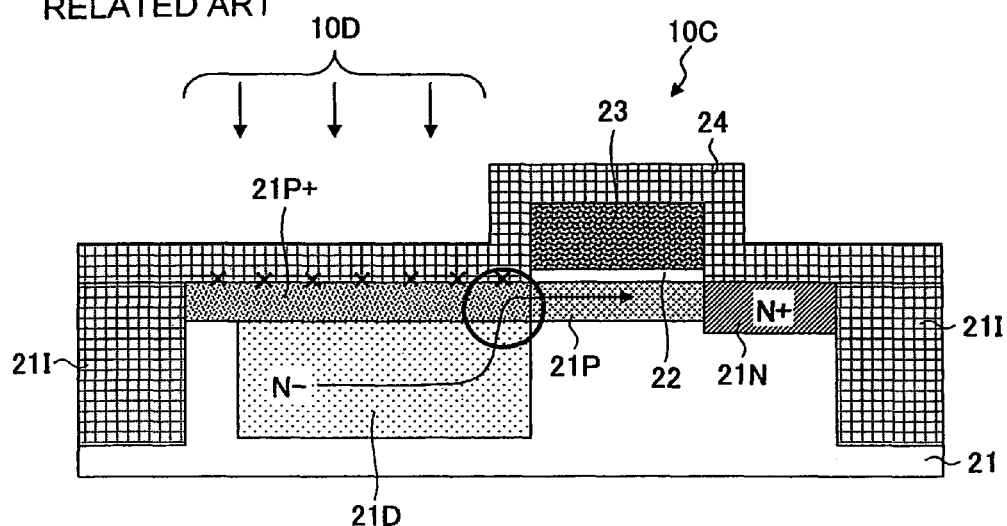
FIGS. 4A and 4B are diagrams showing the construction of a conventional CMOS imaging apparatus.
Figure 4B:
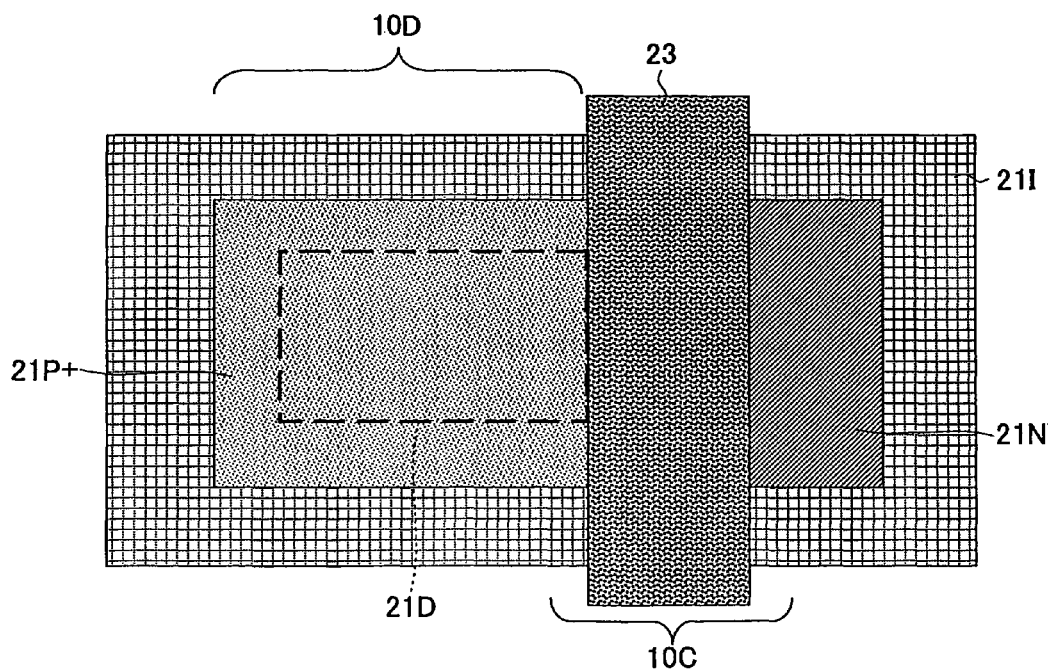
Figure 7:
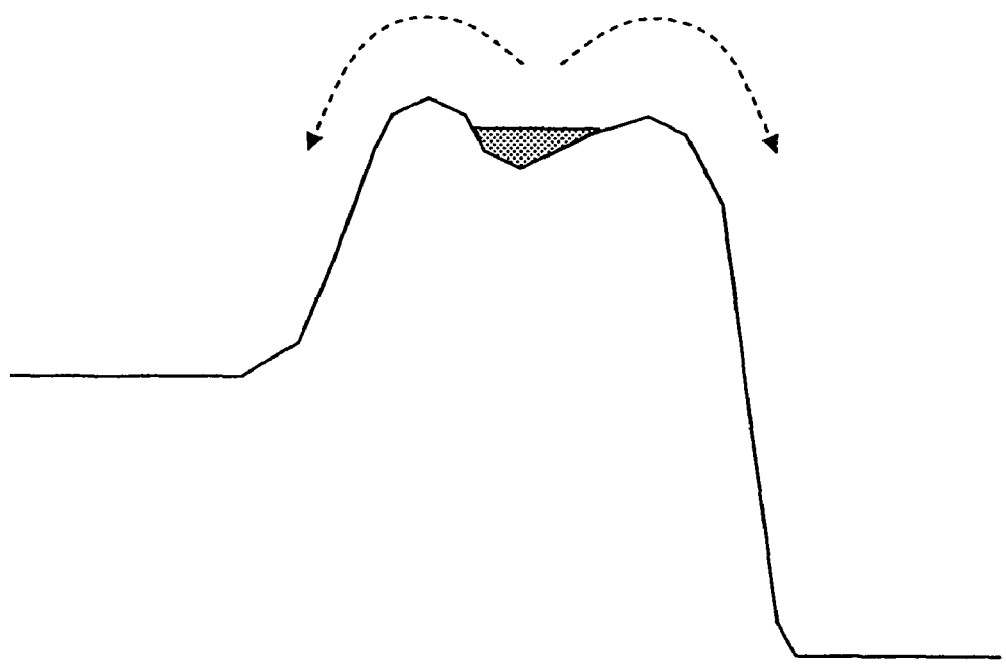
FIG. 7 is a diagram explaining the problems of the CMOS imaging apparatus of FIGS. 5 and 6.
Figure 8:
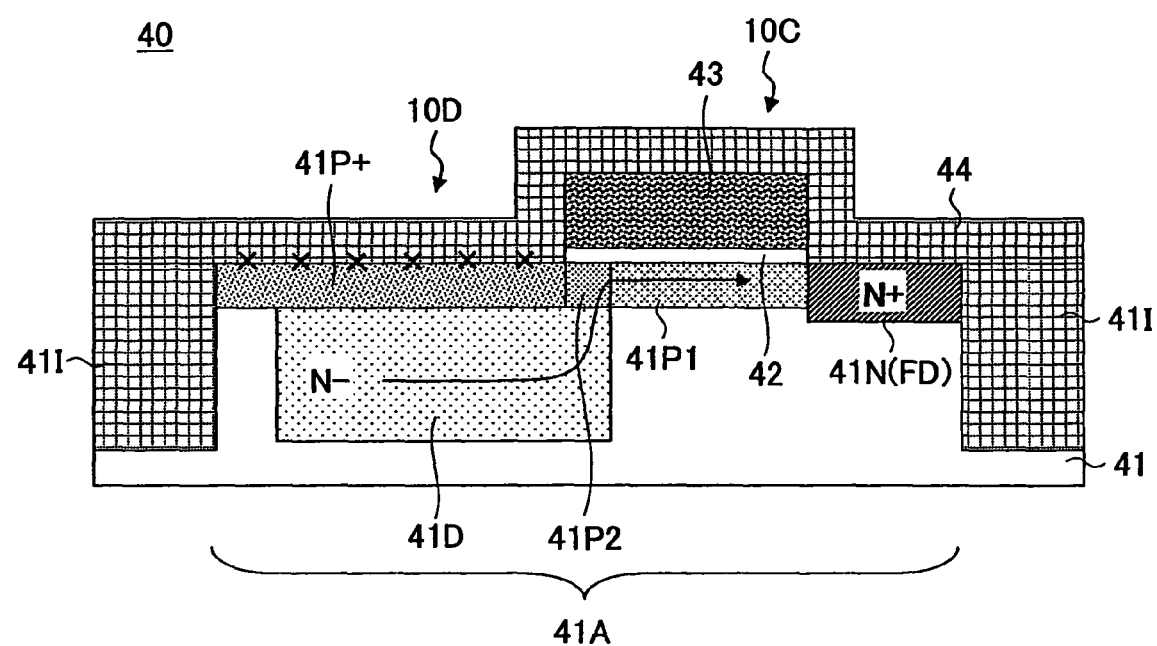
FIG. 8 is a diagram showing the construction of a semiconductor imaging device according to a first embodiment of the present invention.

FIG. 8 is a diagram showing a cross-sectional structure of a semiconductor imaging device 40 according to a first embodiment of the present invention, wherein the semiconductor imaging device 40 corresponds to the transistor 10C and the photodiode 10D of the CMOS imaging apparatus of the FIG. 2.

Referring to FIG. 8, the semiconductor imaging device 40 is formed in a p-type device region 41A defined on a silicon substrate 41 by an STI device isolation structure 41I, wherein there is formed a polysilicon gate electrode 43 on the silicon substrate 41 via a gate insulation film 42 typically of a thermal oxide film in correspondence to a channel region formed in the device region 41A.

In the active region 41A, there is formed a diffusion region 41D of n-type at a first side of the gate electrode 43 as the photodetection region of the photodiode 10D, and a $p^+$-type diffusion region 41P+ is formed on the surface part of the diffusion region 41D as a shielding layer. Further, an $n^+$-type diffusion region 41N is formed in the active layer 41A at an opposite side of the diffusion region 41D with respect to the gate electrode 43 as the floating diffusion region FD.

Further, a CVD oxide film 44 is formed on the silicon substrate 41 so as to cover the device region 41A including the gate electrode 43.

In the present embodiment, the n-type diffusion region 41D is formed such that a tip end part thereof constituting the inner edge part invades to the region underneath the channel region, which is formed right underneath the gate electrode 43, and thus, the photoelectrons formed in the diffusion region 41D can flow to the floating diffusion region 41N through the channel region, when the transistor is turned on, without passing through the shielding layer 41P+ forming a high potential barrier.

Thereby, it should be noted that the present embodiment forms the channel region by a first p-type region 41P1 adjacent to the floating diffusion region 41N and a second p-type region 41P2 adjacent to the shielding layer and sets the concentration level (P2) of the p-type impurity element in the region 41P2 to be larger than the concentration level (P1) of the p-type impurity element in the region 41P1 (P2>P1) but smaller than the concentration level (P3) of the p-type impurity element in the shielding layer 41P+ (P3>P2>P1). Here, it should be noted that the p-type region 41P2 is formed so as to cover the part of the n-type diffusion region 41D that has invaded underneath the channel region.

Figure 9:
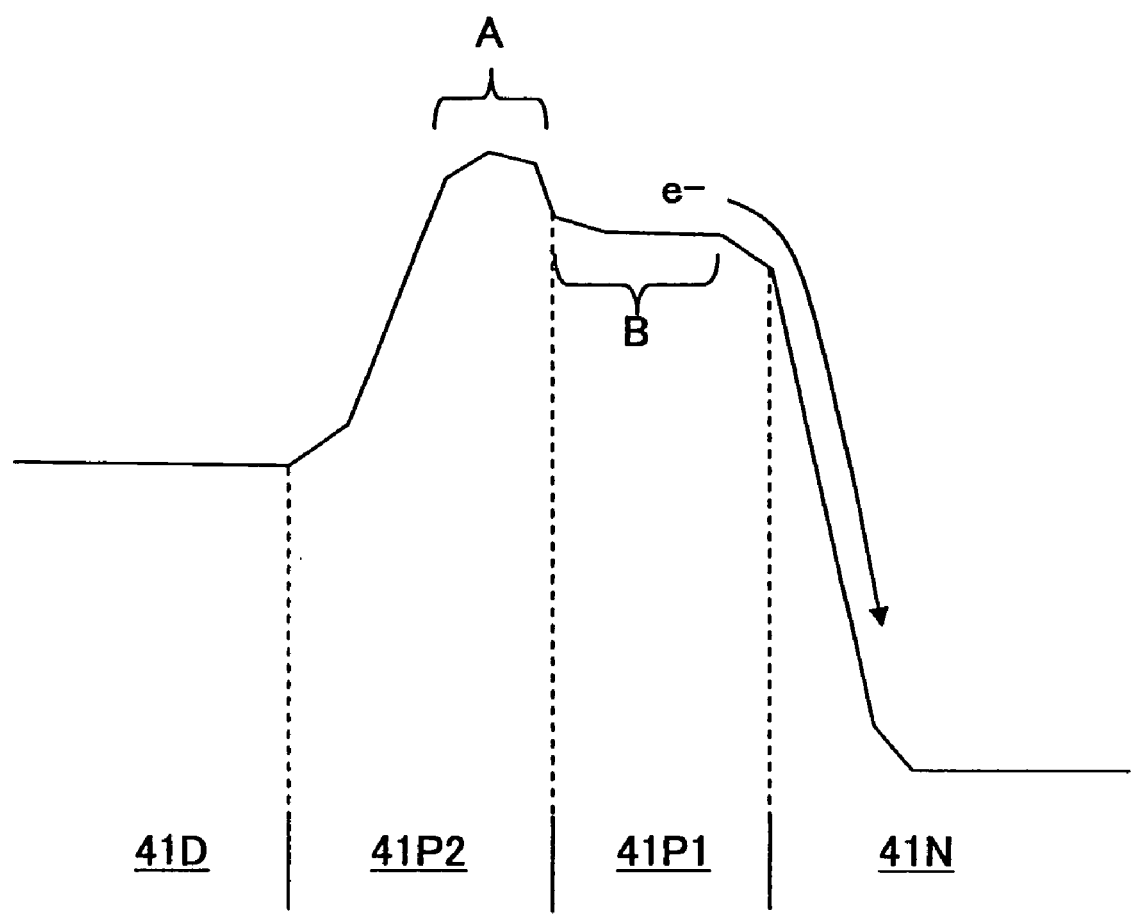
FIG. 9 is a diagram showing a potential distribution profile formed in the channel region of the transfer gate transistor of the semiconductor imaging device of FIG. 8.

With such a construction in which there is formed a slope of impurity concentration level in the channel region, there is formed, in view of the fact that a p-type region forms a barrier against electrons, a potential gradient in the path of the photoelectrons particularly in the channel region right underneath the gate electrode 43 as shown in FIG. 9 such that the potential gradient is inclined toward the floating diffusion region 41N Thus, even when there is caused excitation of thermal electrons in the conduction band of the Si crystal that forms the channel region and thermal electrons are formed at the interface between the silicon substrate 41 and the gate insulation film 22 during the photoreception operational mode of the imaging apparatus, such thermal electrons are discharged to the floating diffusion region 41N immediately along the potential gradient, and there occurs no accumulation of thermal electrons in the channel region. During such a photoreception operational mode, it should be noted that the transfer gate transistor 10C is turned off for enabling accumulation of the photoelectrons in the diffusion region 41D. Further, because of formation of potential barrier by the region 41P2 between the channel region and the diffusion region 41D, the thermal electrons formed in the channel region do not flow to the diffusion region 41D and the problem of noise caused by the mechanism of electrons other than photoelectrons being accumulated in the diffusion region 41D at the time of detecting operation does not take place. Especially, by forming a potential difference of 0.15V or more between the potential peak part A formed in the region 41P2 as shown in FIG. 9 and the flat potential part B in the region 41P1 also shown in FIG. 9, it becomes possible to discharge 99% or more of the thermal electrons formed in the channel region to the floating diffusion region 41N, and it becomes possible to suppress collection of noise at the time of photoreception operational mode effectively. By increasing such a potential difference by 0.1V, the electric charge amount caused by thermal electrons and flowing into the diffusion region 41D can be decreased by the factor of 1/40-1/50.

Further, with such a construction, the diffusion region 41D is shielded effectively from the silicon substrate surface by means of the shielding layer 41P+ of p+-type formed in alignment with the edge part of the gate electrode 43. With this, the influence of the interface states existing at the interface between the silicon substrate 41 and the CVD oxide film 44 on the diffusion region 41D is effectively shielded.

Because of formation of potential barrier in the transportation path of the photoelectrons by the region 41P2, transfer of the photoelectrons is prevented in this part to some extent, wherein it becomes possible with the present invention to minimize the effect of this potential barrier to the efficiency of transfer, by setting the impurity concentration level of the regions 41P2 and 41P1 to be sufficiently small as compared with the impurity concentration level in the shielding layer 41P+. Also, because there is formed a potential gradient inclined toward the floating diffusion region 41N in the region 41P1 behind the region 41P2 as explained previously, the photoelectrons pass through the channel region effectively as a whole, and the imaging apparatus of the present invention is capable of achieving a transfer efficiency comparable to those of the imaging apparatus of Patent References 2 and 3 as noted before.

Hereinafter, the fabrication process of the semiconductor imaging device 40 will be described.

Figure 10A:
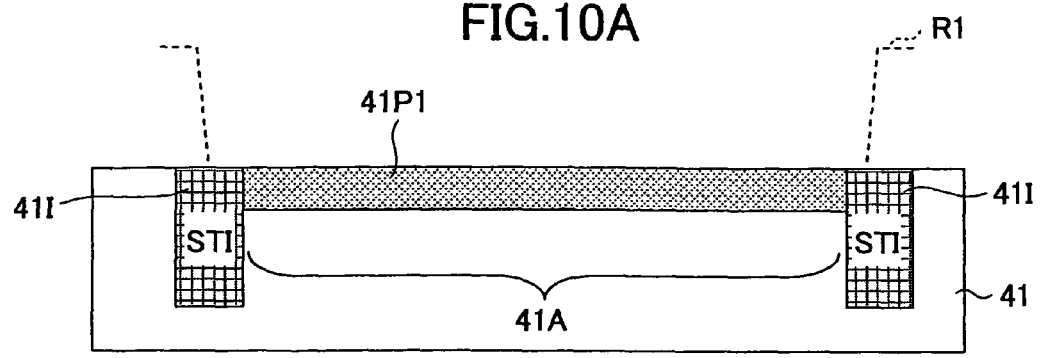
FIGS. 10A-10E are diagrams showing the fabrication process of a semiconductor imaging device of FIG. 8.

Referring to FIG. 10A, there is formed a device region 41A of p-type on the silicon substrate 41 by the device isolation structure 41I, wherein, in the step of FIG. 10A, ion implantation process is conducted via a resist pattern R1 formed on the silicon substrate 41 so as to expose the device region 41A. Further, B+ is injected while using the resist pattern R1 as a mask with an angle of 7 degrees under the acceleration voltage of 10-30 keV with the dose of $0.5$-$2.0 \times 10^{12}$ cm$^{-2}$. Thereby, there is formed a p-type diffusion region constituting the region 41P1 over the entire device region 41A.

Figure 10B:
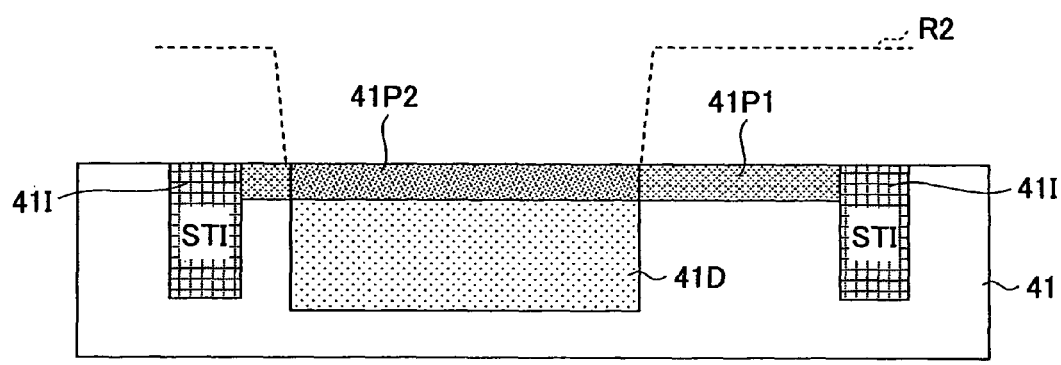

Next, in the step of FIG. 10B, a resist pattern R2 is formed on the silicon substrate 41 so as to expose the region where the diffusion region 41D of the photodiode 10D is to be formed, and ion implantation process of P+ is conducted into the silicon substrate 41 while using the resist pattern R2 as a mask, first under the acceleration voltage of 110-150 keV with the dose of $1$-$3 \times 10^{12}$ cm$^{-2}$ and the angle of 7 degrees, next under the acceleration voltage of 180-220 keV with the dose of $1$-$3 \times 10^{12}$ cm$^{-2}$ and the angle of 7 degrees. With this, the n-type diffusion region 41D is formed.

Further, in the step of FIG. 10B, the same resist pattern R2 is used for the mask and B+ is introduced into the silicon substrate 41 by an ion implantation process conducted under the acceleration voltage of 10-30 keV with the dose of $1$-$3 \times 10^{12}$ cm$^{-2}$ and the angle of 7 degrees. With this, a p-type diffusion region forming the region 41P2 is formed on the surface part of the diffusion region 41D with an impurity concentration level exceeding the impurity concentration level in the diffusion region 41P1.

Figure 10C:
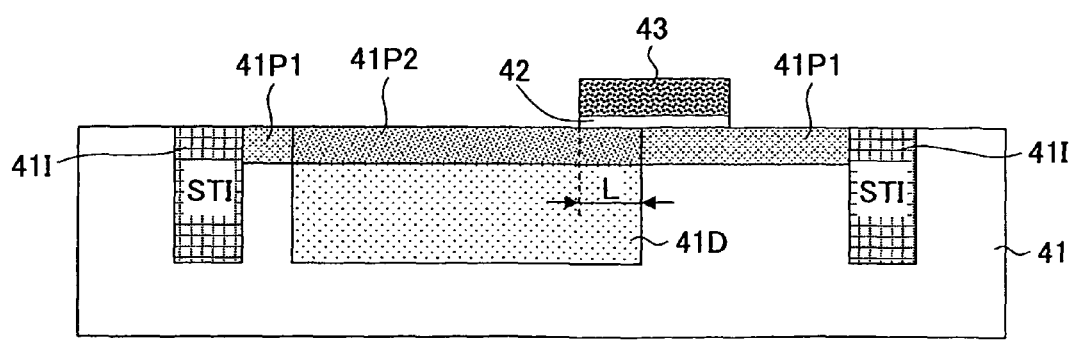

Next, in the step of FIG. 10C, a thermal oxide film is formed on the silicon substrate 41 by a thermal oxidation processing conducted at 800° C. with the thickness of 4-10 nm as the gate insulation film 42, and a polysilicon film is formed thereon by a CVD process with the thickness of about 180 nm. Further, by patterning the polysilicon film, the polysilicon gate electrode 43 and the gate insulation film 42 are formed so as to bridge across the diffusion region 41D and the diffusion region with a gate length of 0.4-0.8 μm. Thereby, it should be noted that the overlap length L of the gate electrode 43 and the n-type diffusion region 41D is set to 0.15-0.40 μm, for example.

Figure 10D:
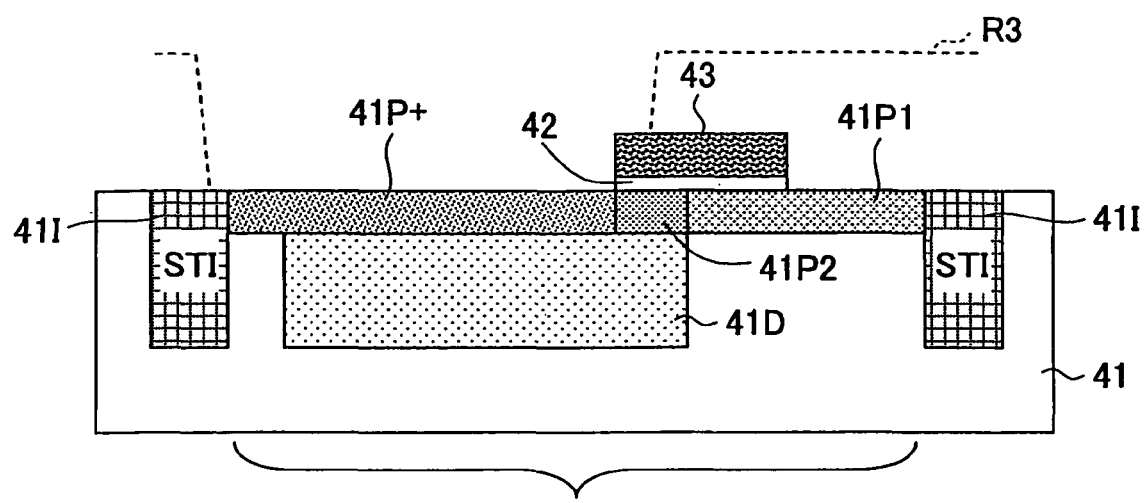

Further, there is formed a resist pattern R3 in the step of FIG. 10D on the structure of FIG. 10C so as to expose a part of the gate electrode 43 and the region where the shielding layer 41P+ is formed, and ion implantation process of B+ is conducted while using the resist pattern R3 as a mask such that B+ is introduced into the silicon substrate under the acceleration voltage of 5-15 keV with the dose of $1$-$5 \times 10^{13}$ cm$^{-2}$ and the angle of 7 degrees. With this, the shielding layer 41P+ is formed in alignment to the sidewall surface of the gate electrode 43. The shielding layer 41P+ thus formed extends from the sidewall surface of the gate electrode 43 to the device isolation structure 41I at the opposite side, wherein it should be noted that the shielding layer 41P+ contains B thus introduced with a substantially uniform concentration level.

Figure 10E:
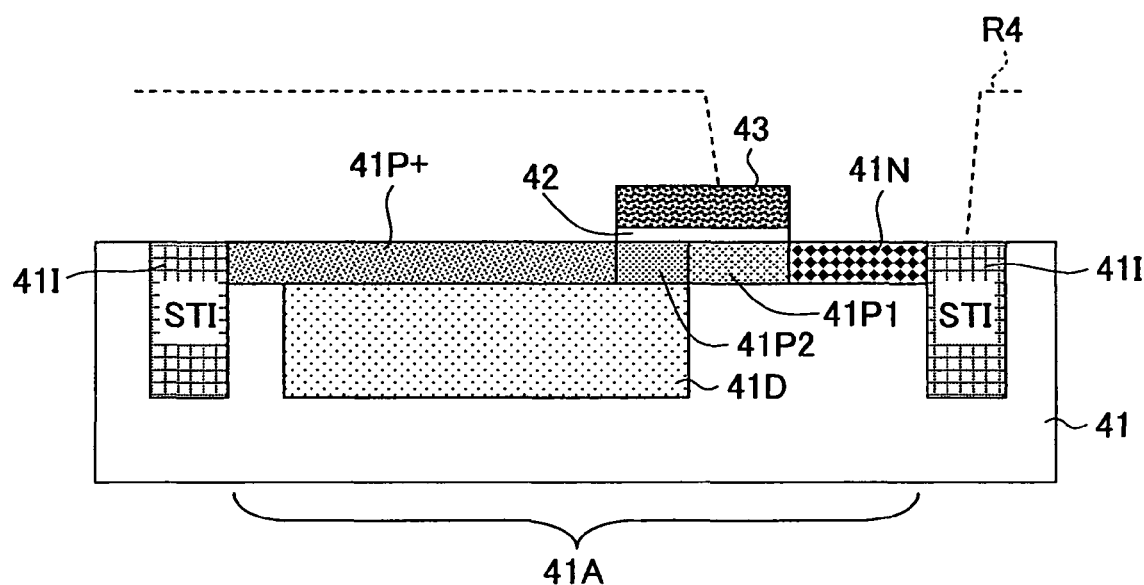

Further, in the step of FIG. 10E, there is formed a resist pattern R4 exposing the part of the device region 41A at the side opposite to the shielding layer 41P+ with respect to the gate electrode 43, and ion implantation process of P+ is conducted into the silicon substrate 41 under the acceleration voltage of 10-30 keV with the dose of 2-50×10$^{12}$ cm$^{-2}$ and the angle of 0 degree, while using the resist pattern R4 as a mask. With this, there is formed an n+-type diffusion region 41N in alignment with the gate electrode 43 as the floating diffusion region FD.

Further, by forming the CVD film 44 on the structure of FIG. 10E, the semiconductor imaging device 40 of FIG. 8 is obtained.

Figure 11A:
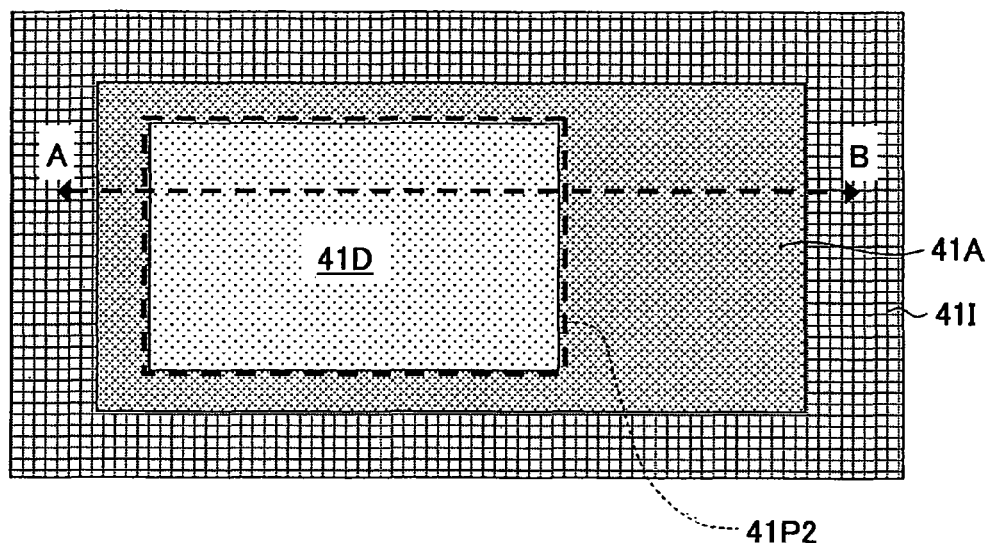
FIGS. 11A and 11B are plan view diagrams showing the construction of the semiconductor imaging device of FIG. 8.

FIG. 11A shows the silicon substrate 41 of the state of FIG. 10B in a plan view.

Referring to FIG. 11A, it can be seen that the device region 41A is formed inside the STI device isolation structure 41I and that the diffusion region 41D of n-type is formed in the device region 41A with an offset from the device isolation structure 41I by at least 0.2 μm. Further, it can be seen that the p-type diffusion region 41P2 is formed in alignment with the n-type diffusion region 41D.

Figure 11B:
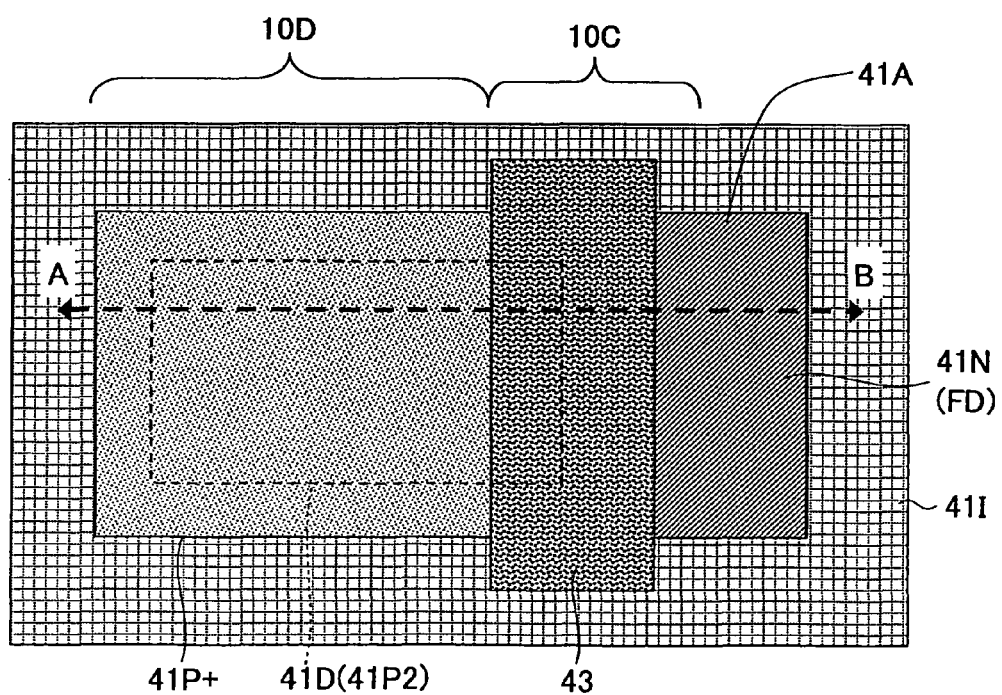

FIG. 11B shows the silicon substrate 41 of the state of FIG. 10E in a plan view.

Referring to FIG. 11B, it can be seen that the active region 41A is formed with the shielding layer 41P+ at the side of the n-type diffusion region 41D with respect to the gate electrode 43 in alignment to the gate electrode 43 and that the inner edge part of the n-type diffusion region 41D invades to the region right underneath the gate electrode 43.

Further, the n-type diffusion region 41N is formed in the active region 41A at the side opposite to the shielding layer 41P+ with respect to the gate electrode 43 in alignment with the gate electrode 43.

FIG. 12 shows the potential formed in the channel region at the time of photoreception operational mode of the semiconductor imaging device of FIG. 8.

Generally, the gate voltage of the transfer gate transistor 10C is set to 0V during the photoreception operational mode of the photodiode 10D in a CMOS imaging apparatus. As explained with reference to FIG. 9, there is induced a potential gradient in the channel region of the transistor 10C with the present embodiment, and flow of thermal electrons excited in the channel region to the photodiode 10D is blocked and flow to the floating diffusion region 41N is facilitated. This state is shown in FIG. 12 by a broken line.

On the other hand, the continuous line of FIG. 12 shows the case in which the gate voltage applied to the gate electrode 43 is set to +0.3-0.7V during the photoreception operational mode.

Thus, by applying a small positive voltage to the gate electrode 43 of the transfer gate transistor 10C during the photoreception operational mode of the CMOS imaging apparatus, the potential of the electrons flowing through the path shown in FIG. 8 by the arrow undergoes a significant effect with the foregoing small gate voltage particularly in the part where the electrons are transported at a shallow depth and hence along the path near the gate electrode 43. Thereby, the potential level of the electrons is lowered significantly as shown in FIG. 12 by an arrow A. On the contrary, in the channel region 41P2 in which the electrons are transported through the silicon substrate 41 at a greater depth, the influence of the gate electrode is small and the potential of the electrons changes only by a small amount as shown in FIG. 12 by an arrow B.

Thus, by applying a small positive voltage to the gate electrode 43 of the transfer gate transistor 10C, it becomes possible to increase the potential gradient formed in the channel region further. Thereby, occurrence of noise can be suppressed further.

Second Embodiment

Figure 13A:
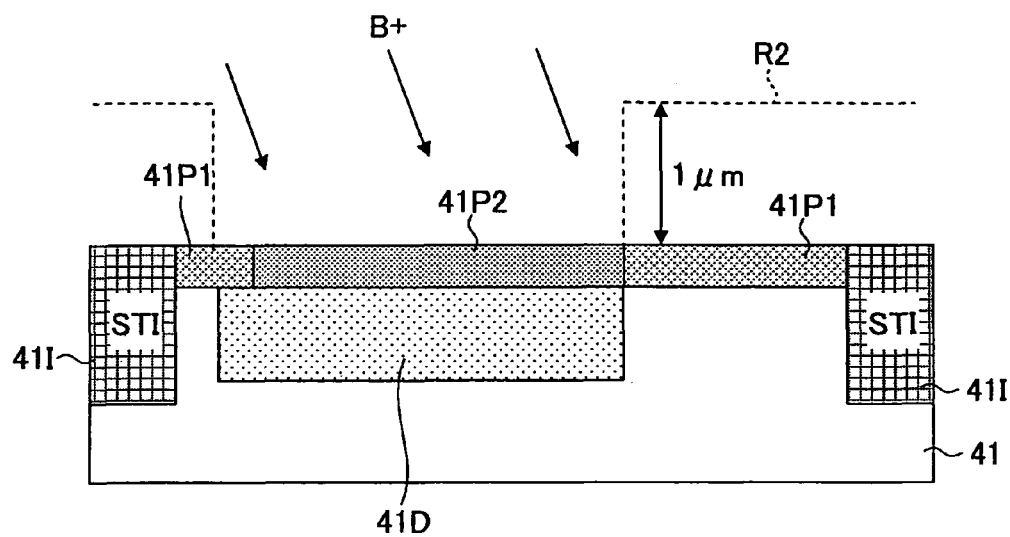
FIGS. 13A and 13B are diagrams showing the fabrication process of a semiconductor imaging device according to a second embodiment of the present invention.
Figure 13B:
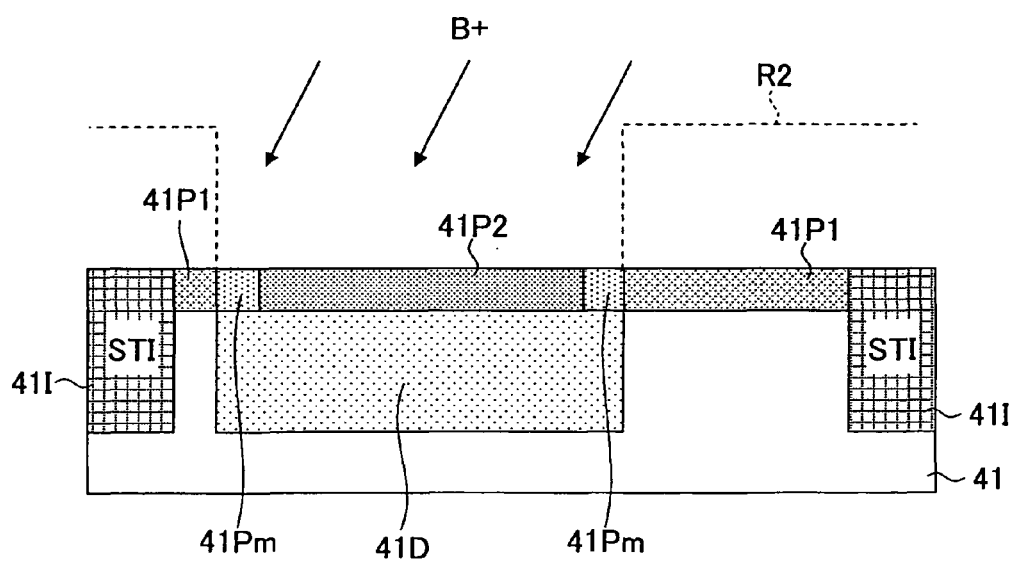
Figure 14:
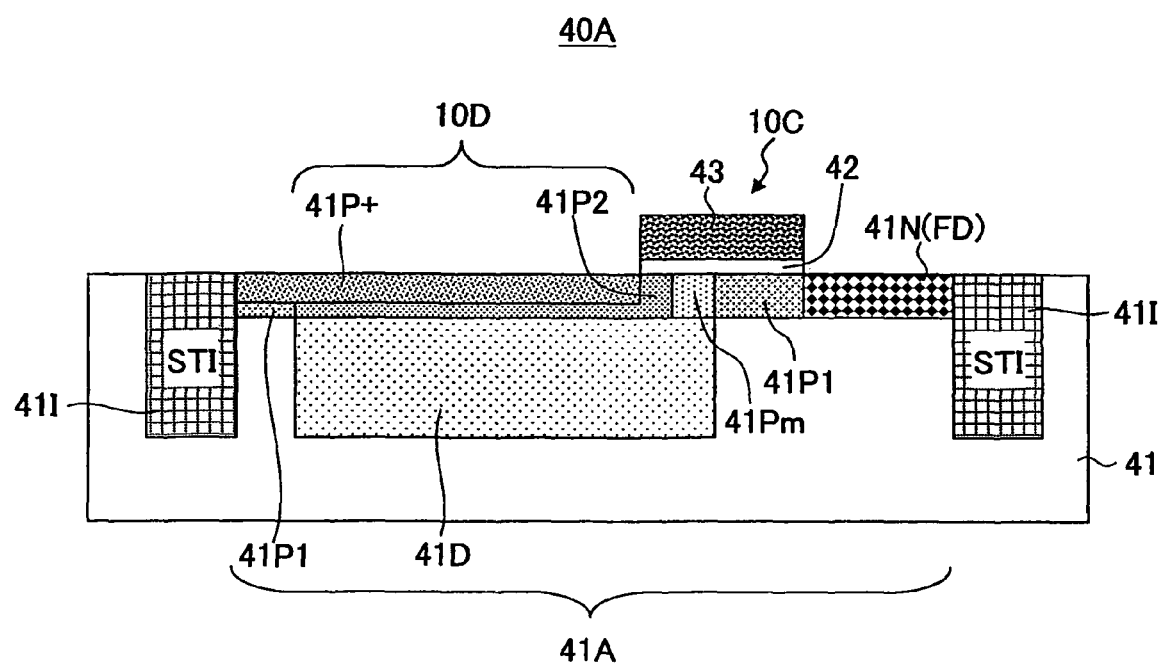
FIG. 14 is a diagram showing construction of a semiconductor imaging device according to a second embodiment of the present invention.

FIGS. 13A and 13B are diagrams showing a modification of the ion implantation process of FIG. 10B according to a second embodiment of the present invention while FIG. 14 is a diagram showing a semiconductor imaging device 40A fabricated according to the process of FIGS. 13A and 13B.

Referring to FIGS. 13A and 13B, the present embodiment sets the thickness of the resist pattern R2 formed on the silicon substrate 41 at the time of forming the p-type diffusion region 41P2 in the step of FIG. 10B to be about 1 μm, and ion implantation of B+ is conducted to the surface of the n-type diffusion region 41D with the angle of 7 degrees in at least two directions.

In this case, the dose of ion implantation is reduced in the shadow part of the resist pattern R2 as shown in FIG. 13B, and there is formed a region 41pm of intermediate impurity concentration level between the p-type region 41P2 and the p-type diffusion region 41P1.

Thus, in the case the process of FIG. 10C and later are applied to such a structure, there is formed a p-type diffusion region 41pm having a B concentration level Pm between the p-type diffusion region 41P1 (having the B concentration level P1) and the p-type diffusion region 41P2 (having the B concentration level P2) such that the B concentration level is intermediate between P1 and P2 (P2>Pm>P1).

When such an intermediate region 41Pm is formed with a width of 0.15 μm, and when the overlapping of the n-type diffusion region 41D under the gate electrode 43 is 0.3 μm, for example, the width of the region 41P2 adjacent to the intermediate region 41Pm becomes also about 0.15 μm.

Thus, by forming the intermediate region 41Pm between the regions 41P2 and 41P1, the potential formed in the channel region as shown in Figure is modified such that the flat part is reduced. Thereby, discharging of the thermal electrons to the floating diffusion region is facilitated further.

In the example of FIG. 14, it should be noted that the shielding layer 41P+ is formed only on the surface part of the diffusion regions 41P1 and 41P2, while the shielding layer 41P can effectively shield the effect of the surface states on the silicon substrate surface to the photoelectrons excited in the diffusion region 41D also with such a construction.

Third Embodiment

Figure 15A:
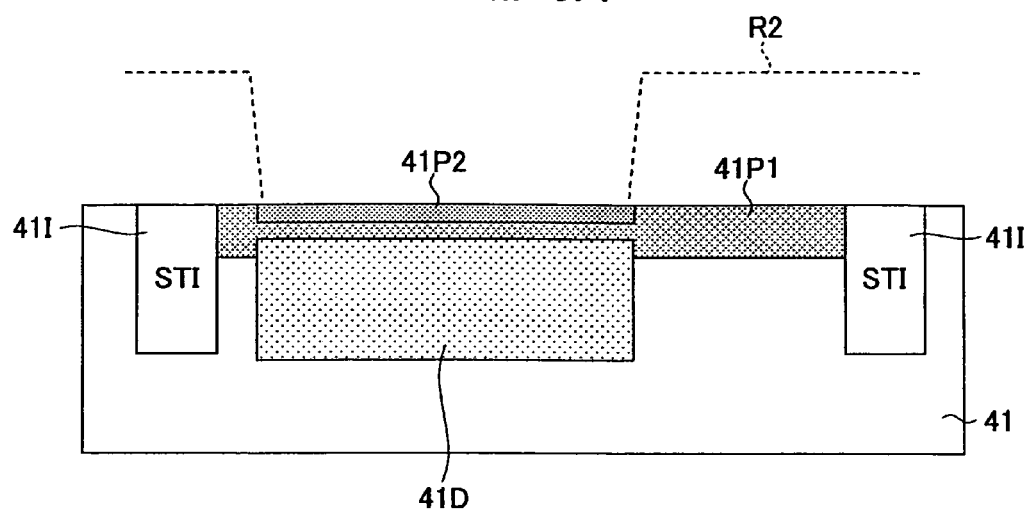
FIGS. 15A and 15B are diagrams showing the fabrication process of semiconductor imaging device according to a third embodiment of the present invention.
Figure 15B:
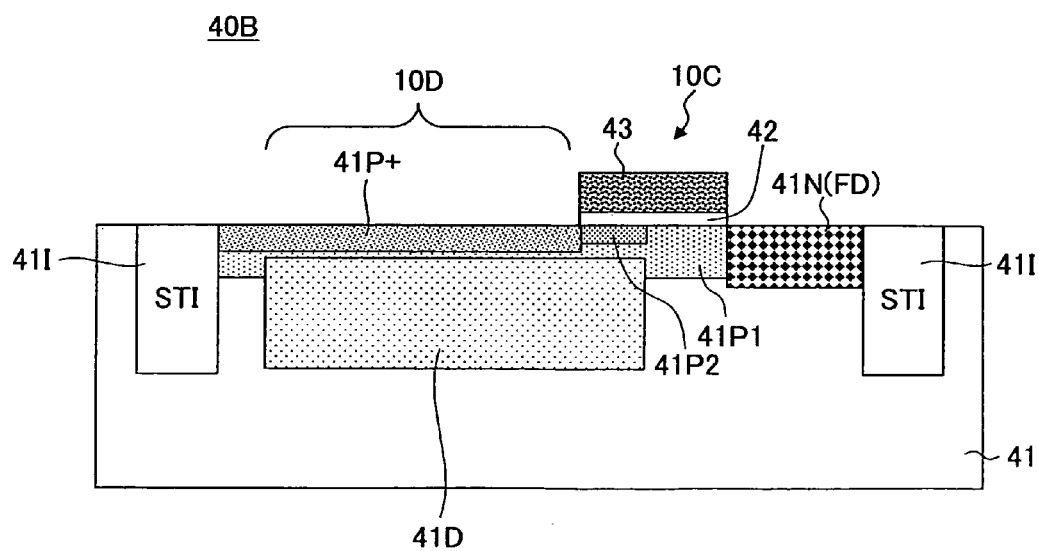

FIGS. 15A and 15B show the fabrication process of a semiconductor imaging device 40B according to a third embodiment of the present invention, wherein those parts corresponding to the parts explained previously are designated by the same reference numerals and the description thereof will be omitted.

FIG. 15A shows a process corresponding to the process of FIG. 10B except that the p-type diffusion region 41P2 is formed at a shallower level than the p-type diffusion region 41P1. For example, in the step of FIG. 15A, ion implantation process of B$^+$ is conducted under the acceleration voltage of 8-15 keV with the dose of 0.5-3.0×10$^{12}$ cm$^{-2}$ and the angle of 7 degrees, while using the resist pattern R2 as a mask, in overlapping relationship with the n-type diffusion regions 41D.

As a result of such an ion implantation process, the p-type region 41P2 forming the potential barrier in the channel region right underneath the gate electrode 43 is formed only at the surface part of the channel region in the structure obtained after the step of FIG. 10C as shown in FIG. 15B, and thus, it becomes possible to control the potential barrier by the gate voltage applied to the gate electrode 43 easily. Thereby, it becomes possible to improve the transfer efficiency of photoelectrons in the transfer operational mode for transferring the photoelectrons from the diffusion region to the floating diffusion region 41N via the transfer gate transistor 10C.

Further, with the construction of FIG. 15B, it becomes possible to form the p-type diffusion region 41P1 with an increased depth as compared with the p-type diffusion region 41P2, and it becomes possible to suppress the punch-through between the n-type diffusion region 41D and the n-type diffusion region 41N.

Fourth Embodiment

FIGS. 16A-16D show the fabrication process of a semiconductor imaging device 40C according to a fourth embodiment of the present invention, wherein those parts corresponding to the parts explained previously are designated by the same reference numerals and the description thereof will be omitted.

Figure 16A:
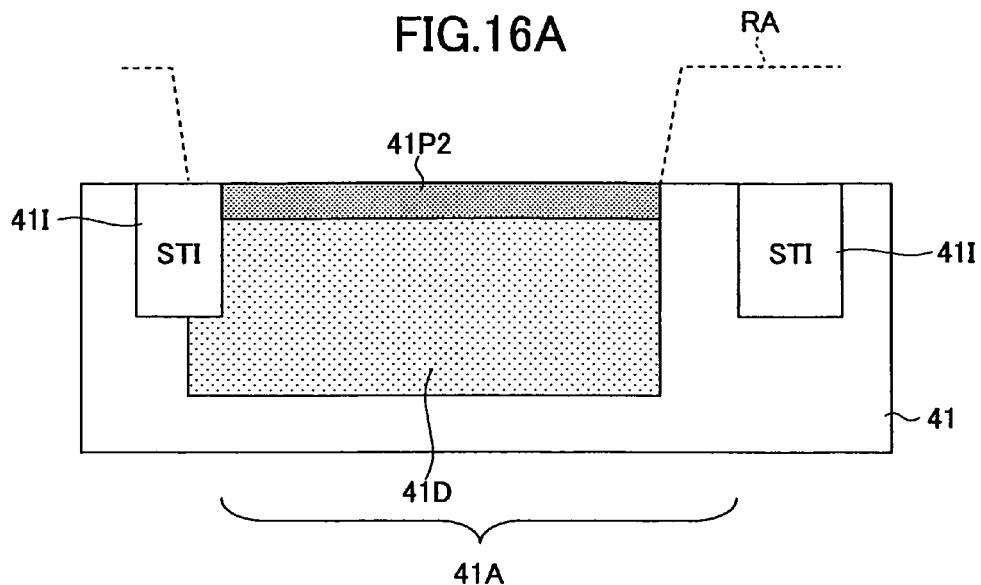
FIGS. 16A-16D are diagrams showing the fabrication process of a semiconductor imaging device according to a fourth embodiment of the present invention.

Referring to FIG. 16A, a part of the active region 41A in the silicon substrate 41 is introduced first with $P^+$ under the acceleration voltage of 110-150 keV with the dose of $1-3 \times 10^{22}$ $cm^{-2}$ and the angle of 7 degrees, next under the acceleration voltage of 180-220 keV with the dose of $0.5-1.5 \times 10^{12}$ $cm^{-2}$ and the angle of about 7 degrees, and further under the acceleration voltage of 300-600 keV with the dose of $0.5-1.5 \times 10^{12}$ $cm^{-2}$, while using the resist pattern RA as a mask. With this, the n-type diffusion region 41D is formed at a depth lower than the bottom edge of the device isolation structure 41I, which has the depth of 350-400 nm.

Further, in the step of FIG. 16A, $B^+$ is introduced by an ion implantation process while using the same resist pattern RA as a mask under the acceleration voltage of 10-30 keV with the dose of $2-5 \times 10^{12}$ $cm^{-2}$ and the angle of about 7 degrees. With this, the p-type diffusion region 41P2 is formed on the surface of the n-type diffusion region 41D.

Figure 16B:
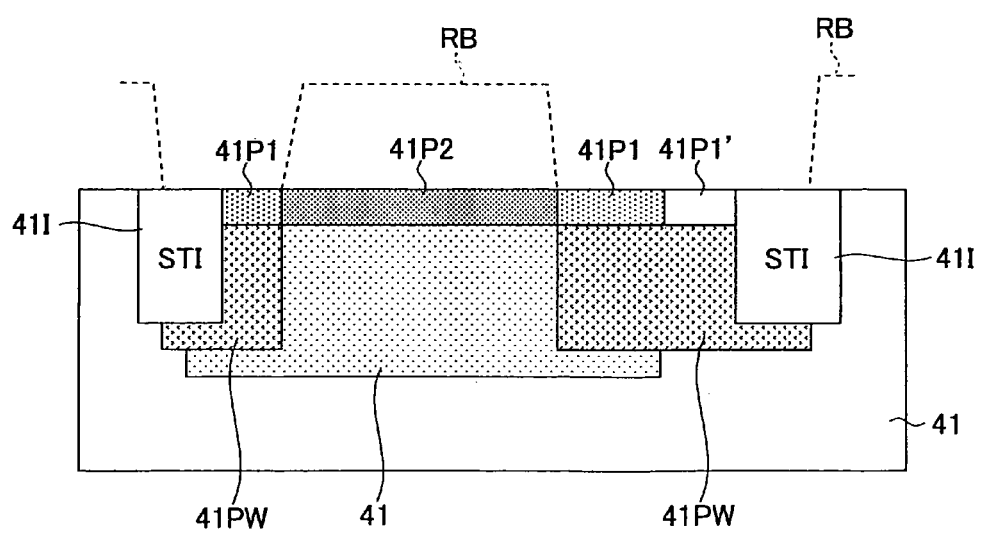

Next, in the step of FIG. 16B, a resist pattern RB is formed such that a part of the active region 41A in the vicinity of the device isolation structure 41I, a part of the channel region of the transistor 10C to be formed and the region where the floating diffusion region FN is to be formed are exposed and such that the resist pattern RB also covers the majority of the n-type diffusion region 41D, and ion implantation of $B^+$ is conducted first under the acceleration voltage of 65 keV with the dose of $2-10 \times 10^{12}$ $cm^{-2}$ and the angle of about 7 degrees, next under the acceleration voltage of 100 keV with the dose of $1.5-5 \times 10^{12}$ $cm^{-2}$ and the angle of about 7 degrees, and further under the acceleration voltage of 140 keV with the dose of $1.5-5 \times 10^{12}$ $cm^{-2}$ and the acceleration voltage of 180 keV with the dose of $1-5 \times 10^{12}$ $cm^{-2}$ and the angle of about 7 degrees, while using the resist pattern RB as a mask.

With this, the n-type conductivity type formed already for the diffusion region 41D is in the step of FIG. 16A is cancelled out in the region along the device isolation structure 41I, and there is formed a p-type well 41PW in such a part with a depth of about 0.1 μm as measured from the bottom edge of the device isolation structure 41I such that the bottom edge of the n-type diffusion region 41D is not exposed to the bottom edge of the device isolation structure 41I.

Further, in the step of FIG. 16B, ion implantation of $As^+$ is conducted while using the same resist pattern RB as a mask under the acceleration voltage of 50-80 keV with the dose of $1-2 \times 10^{12}$ $cm^{-2}$. Thereby, the p conductivity type formed as a result of ion implantation of B to the surface of the silicon substrate for formation of the well 41PW and the diffusion region 41P2 is partly canceled out, and the p-type diffusion regions 41P1 and 41P1' are formed with lower hole concentration level.

Figure 16C:
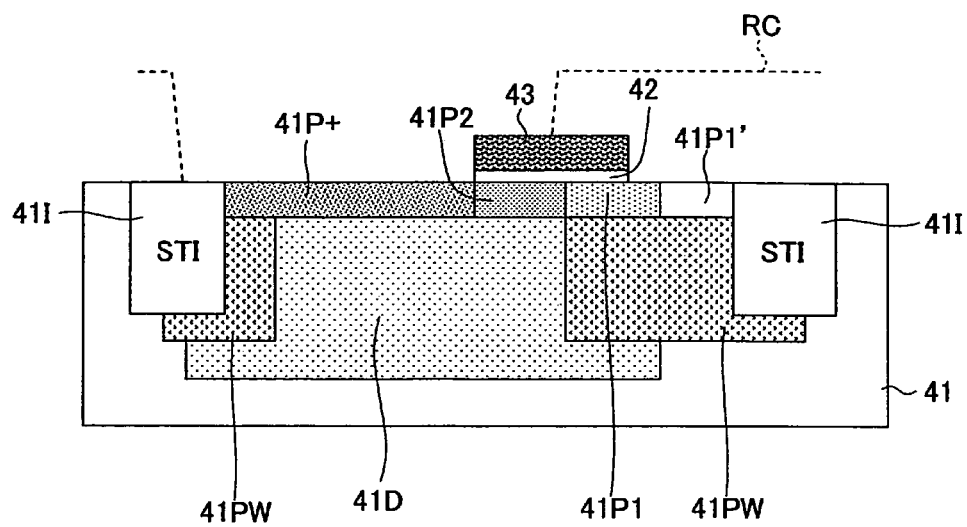

Further, in the step of FIG. 16C, the polysilicon gate electrode 43 is formed on the silicon substrate 41 via the gate insulation film 42 in correspondence to the channel region of the transfer gate transistor to be formed in the device region 41A so as to bridge across the boundary between the diffusion regions 41P2 and 41P1.

Further, in the step of FIG. 16C, there is formed a resist pattern RC so as to cover a part of the polysilicon gate electrode 43 and the surface of the silicon substrate 41 where the floating diffusion region FN is to be formed, and $B^+$ is introduced into the silicon substrate 41 under the acceleration voltage of 5-15 keV with the dose of $1-5 \times 10^{13}$ $cm^{-2}$ while using the resist pattern RC as a mask. With this, the shielding layer 41P+ is formed on the surface of the n-type diffusion region 41D.

Figure 16D:
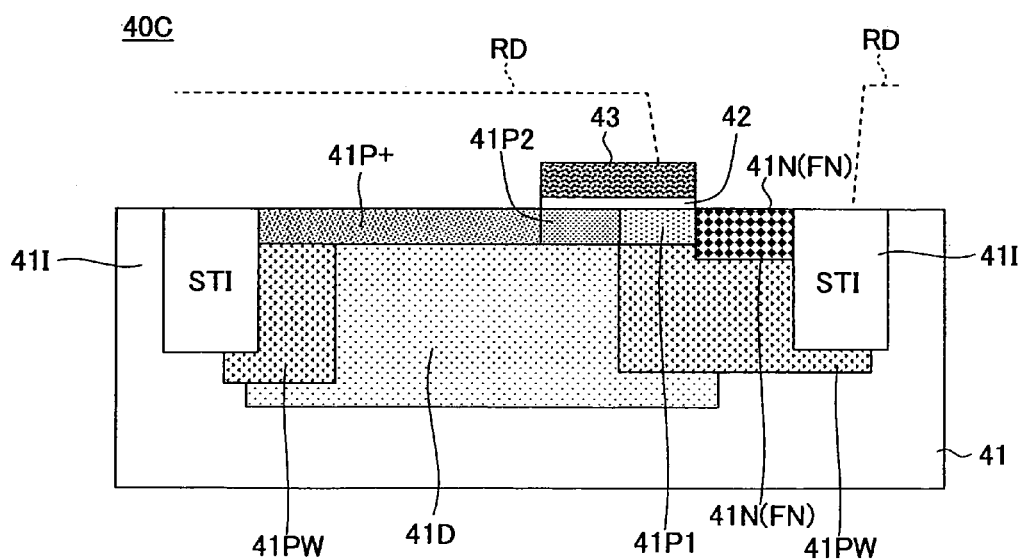

Further, in the step of FIG. 16D, there is formed a resist pattern RD so as to cover the device region 41A for a part of the polysilicon gate electrode and the surface of the silicon substrate 41 formed with the shielding layer 41P+, and ion implantation of $P^+$ is conducted into the silicon substrate under the acceleration voltage of 10-30 keV and the dose of $2-5 \times 10^{13}$ $cm^{-2}$ with the angle of 0 degrees while using the resist pattern RD as a mask. With this, an n-type diffusion region 41N is formed as the floating diffusion region FN.

With the semiconductor imaging device 40C of such a construction, there is a large opening area forth resist pattern RA used with the step of FIG. 16A, and thus, it becomes possible to use a thick resist pattern for the ion implantation mask RA. Thereby, it becomes possible to form the n-type diffusion region 41D constituting the photodiode 10D to a depth exceeding the bottom edge of the device isolation structure 41I by using large ion implantation energy. As a result, the depletion layer extends deeply in the photoreception operational mode, and it becomes possible to collect the incoming photons with large detection volume. With this, the S/N ratio of the imaging device is improved further.

With the preset embodiment, too, there is formed a potential gradient in the channel region right underneath the gate electrode 43 by the p-type diffusion regions 41P2 and 41P1, and thermal electrons formed in the channel region during the photoreception operational mode are positively discharged to the floating diffusion region FN and the effect thereof to the signal detection can be eliminated.

In the present embodiment, it should be noted that the p-type diffusion regions 41 P1 and 41P2 contain B and As at the same time, and the difference of carrier concentration level leading to the potential gradient is caused by the difference of concentration level of B and As in each of these regions.

Fifth Embodiment

Figure 17A:
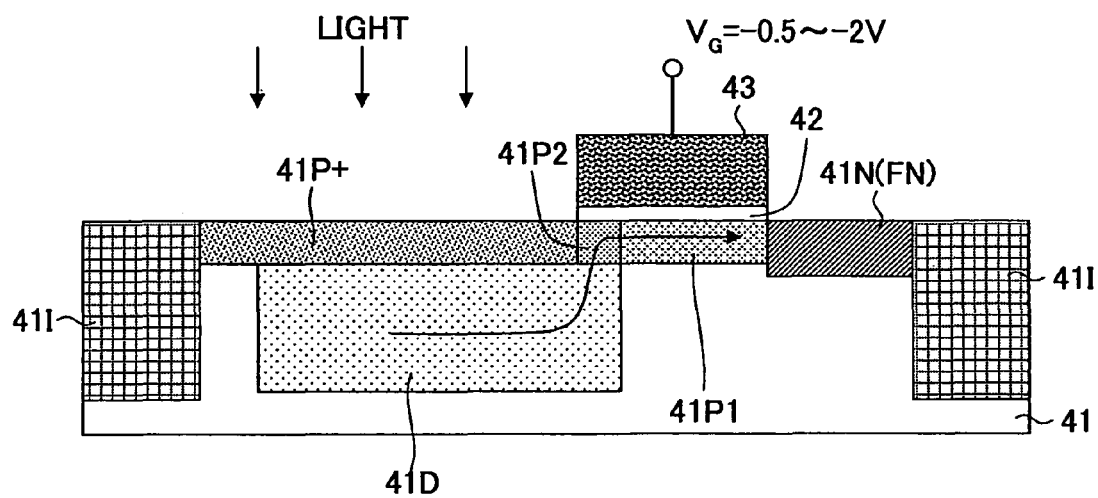
FIGS. 17A and 17B are diagrams showing an example of driving of the transfer gate transistor at the time of detecting operation of a semiconductor imaging device according to a fifth embodiment of the present invention.

FIG. 17A shows a fifth embodiment of the present invention.

Referring to FIG. 17A, the present embodiment uses the semiconductor imaging device 40 of FIG. 8 explained before except that a negative voltage in the range of −0.5-2V is applied to the gate electrode 43 in the photoreception operational mode as represented in the drawing.

In the semiconductor imaging device, the transfer gate transistor 10C is an n-channel MOS transistor and the channel region is doped to p-type.

When a negative voltage is applied to the gate electrode 43 as noted above, there is caused an accumulation state of holes in the channel region, while such accumulation state of holes in the channel region suppresses the occurrence of thermal excitation of electrons and hence occurrence of dark current.

Thus, according to the present invention, it becomes possible to suppress the dark current by applying a small negative voltage to the transfer gate transistor 10C in the CMOS imaging apparatus at the photoreception operational mode thereof.

Figure 17B:
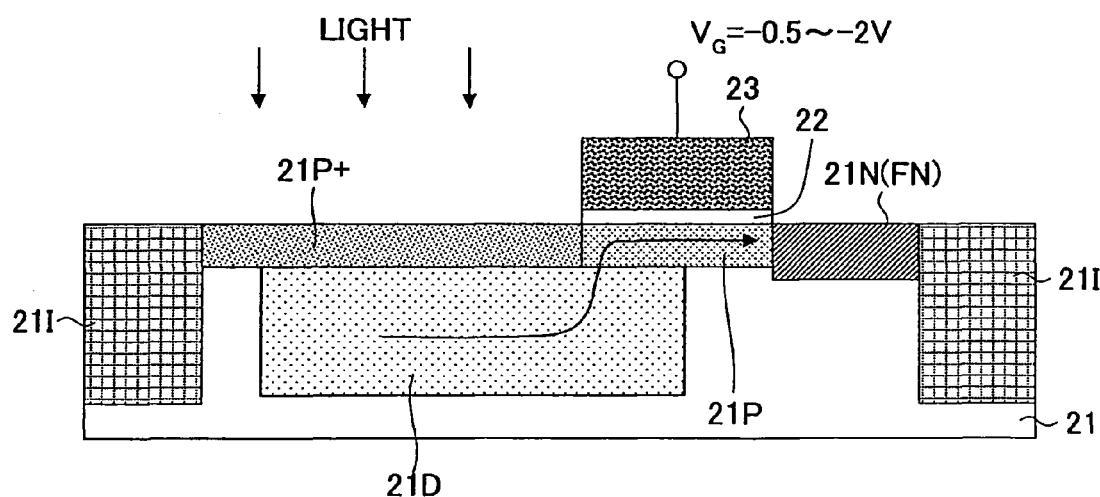

It should further be noted that suppressing of dark current by the same principle is effective also in a conventional semiconductor imaging device shown in FIG. 17B.

Referring to FIG. 17B, the semiconductor imaging device is identical to the one explained with reference to FIG. 6, wherein it is possible to suppress occurrence of dark current caused by thermal electrons excited in the channel region by similarly applying a gate voltage of −0.5--2V to the gate electrode 23 at the time of photoreception operational mode thereof so that thermal excitation of electrons is suppressed.

Further, while the present invention has been explained with reference to preferred embodiments, it should be noted that the present invention is by no means limited to such specific embodiments but various variations and modifications may be made without departing from the scope of the invention.

What is claimed is:

1. A method of fabricating a semiconductor imaging device, comprising the steps of:

forming a first diffusion region of a first conductivity type at a surface of a silicon substrate by introducing an impurity element of said first conductivity type into an active region defined on said silicon substrate such that said first diffusion region is formed over an entire surface of said active region with a first depth and a first impurity concentration level;

forming a photodetection region of a second conductivity type underneath said first diffusion region, by covering a first part of said first diffusion region by a first mask pattern and introducing an impurity element of a second conductivity type into said active region in overlapping relationship with said first diffusion region while using said first mask pattern as a mask, such that said impurity element of said second conductivity type is introduced to a second depth deeper than said first depth;

forming a second diffusion region of said first conductivity type on said photodetection region, by introducing an impurity element of said first conductivity type into said active region in overlapping relationship with said photodetection region while using said first mask pattern as a mask to a depth of said first depth or shallower, such that said second diffusion region contains said impurity element of said first conductivity type with a second impurity concentration level higher than in said first diffusion region;

forming a gate electrode on said silicon substrate via a gate insulation film such that said gate electrode covers a boundary of said first diffusion region and said second diffusion region;

forming a shielding layer of a diffusion region of said first conductivity type at a surface of said second diffusion region, by introducing an impurity element of said first conductivity element into said active region while using said gate electrode and a second mask pattern covering a part of said active region at a side opposite to said photodetection region with regard to said gate electrode as a mask, such that said shielding layer contains said impurity element of said first conductivity type with a third impurity concentration level larger than said second impurity concentration level; and forming a floating diffusion region of said second conductivity type by introducing an impurity element of said second conductivity type into said active region while using said gate electrode and a third mask pattern covering a part of said active region at a side of said photodetection region with respect to said gate electrode as a mask.

2. The method as claimed in claim 1, wherein said step of forming said second diffusion region comprises plural ion implantation process steps for introducing an impurity element of said first conductivity type with an oblique angle to a substrate of said silicon substrate, said plural ion implantation process steps being conducted while changing a direction of injection of said impurity element.

* * * * *